United States Patent
Bisset

(10) Patent No.: US 7,020,568 B2
(45) Date of Patent: Mar. 28, 2006

(54) APPARATUS AND METHOD FOR GENERATING WANDER NOISE

(75) Inventor: David Alexander Bisset, Conon Bridge (GB)

(73) Assignee: Agilent Technologies, Inc., Palo Alto, CA (US)

( * ) Notice: Subject to any disclaimer, the term of this patent is extended or adjusted under 35 U.S.C. 154(b) by 122 days.

(21) Appl. No.: 10/685,639

(22) Filed: Oct. 15, 2003

(65) Prior Publication Data

US 2004/0083067 A1    Apr. 29, 2004

(30) Foreign Application Priority Data

Oct. 18, 2002  (EP) ................... 02257268

(51) Int. Cl.
*G01R 23/00* (2006.01)
(52) U.S. Cl. .............. 702/75; 702/69; 702/79; 702/190; 702/191
(58) Field of Classification Search .......... 702/75, 702/76, 69, 79, 189, 190, 191; 375/222, 375/376; 704/205, 206, 226, 258, 268
See application file for complete search history.

(56) References Cited

U.S. PATENT DOCUMENTS 5,631,920 A * 5/1997 Hardin ................. 375/130
6,687,319 B1 * 2/2004 Perino et al. .......... 375/367

FOREIGN PATENT DOCUMENTS

| EP | 0828343 A1 | 3/1998 |
| EP | 1152562 A1 | 11/2001 |
| EP | 1164696 A1 | 12/2001 |
| EP | 1167985 A2 | 1/2002 |

\* cited by examiner

*Primary Examiner*—Bryan Bui

(57) ABSTRACT

A method generating wander noise includes predefining frequency, amplitude and phase values for each of a plurality of tones for various predefined frequency profiles. A digital noise signal having a particular profile can then be generated by a summation of a plurality of tones based on the predefined frequency, amplitude and phase values for each of the plurality of tones for the selected profile. The wander noise signal is then generated from the digital noise signal.

15 Claims, 5 Drawing Sheets

APPARATUS AND METHOD FOR GENERATING WANDER NOISE

FIELD OF THE INVENTION

This invention relates to an apparatus and a method for generating wander noise, particularly, though not exclusively, for producing wander noise that matches a predefined noise profile. The invention may be applied in the measurement of timing errors in digital transmission systems, for example, standardised measurement known as Timing Deviation (TDEV) in Synchronous Digital Hierarchy (SDH) digital transmission systems in accordance with specifications as set out by the ITU-T ("ITU" stands for International Telecommunications Union).

BACKGROUND OF THE INVENTION

Modern telecommunications networks demand a high degree of synchronisation between network transmission elements. For all network transmission elements in SDH architectures, timing is critical. However, phase variations in the reference clock frequencies governing synchronous network elements may introduce errors at various stages in the network.

Degradation of synchronisation in an SDH network may be due to several factors. Common causes include variations in propagation times in cabling and frequency drifts due to temperature changes in the Phase Locked Loops (PLLs) used. Errors in synchronisation may also occur if a Synchronisation Supply Unit (SSU) or SSDH Equipment Clock (SEC) operates out of the ideal locked mode and in holdover or free-running modes. Any general re-configuration event in the synchronisation chain may give rise to transient events, as will a change of a Primary Reference Clock (PRC) in international links.

Variations in the timing signal may be broadly split into two categories. In the ITU specifications, short term variations which are of frequency greater than or equal to 10 Hz are referred to as "jitter". Longer term variations, which are of frequency less than 10 Hz, are referred to as "wander".

Since there are strict regulations governing timing it is necessary to have some means of measuring and identifying faults and errors. Three important measurements of network timing errors in the ITU recommendations are the Time Interval Error (TIE), Maximum TIE (MTIE), and Time Deviation (TDEV). Of principal interest for the present invention is TDEV, which is a measure of the time variation of a signal over a specific integration time (observation interval). TDEV is measured in units of time and is derived from a sequence of Time Interval Error (TIE) samples. TDEV can provide information on the noise signal. TDEV values, together with other parameters, are used to evaluate the performance of equipment and systems, often to diagnose a fault which has developed and which impairs customer service.

In order to test the ability of a device to operate in a telecommunication network with noise present, a noise source signal can be injected into the device, which will emulate noise with a recommended characteristic. TDEV can be used as such a characteristic in order to test telecommunications networks. In order to do so, a wander noise signal having a particular frequency profile corresponding to the TDEV needs to be generated. Traditionally, methods of wander noise generation use a Pseudo Random Binary Sequence (PRBS), which produces an approximately white phase spectrum. A sequence generated by a PRBS is then filtered to produce a frequency spectrum that is a satisfactory approximation to the required TDEV wander noise profile.

BRIEF SUMMARY OF THE INVENTION

The present invention therefore seeks to provide a method and apparatus for generating wander noise, especially wander noise that matches a predefined profile, such as TDEV.

Accordingly, in a first aspect, the invention provides a method for generating wander noise according to a predefined frequency profile, the method comprising the steps of selecting one of a plurality of predefined frequency profiles, providing predetermined frequency, amplitude and phase values for each of a plurality of tones for the selected predefined frequency profile, generating a digital noise signal based on the sum of the plurality of tones, and generating a wander noise signal from the digital noise signal.

The method may further comprise the step of adding a centre frequency signal to the digital noise signal before the wander noise signal is generated.

In one embodiment, the predetermined frequency values for each of the plurality of tones are determined by the steps of defining a required frequency profile, determining a frequency range for the required frequency profile, the required frequency range having upper and lower frequency limits, determining the plurality of tones required to provide a desired tone density in the determined frequency range, and determining frequency values for each of the plurality of tones.

The step of determining frequency values for each of the plurality of tones may comprise the step of determining a geometrical tone spacing between the upper and lower frequency limits.

The predetermined amplitude values for each of the plurality of tones may be determined by the step of iteratively determining an amplitude value for each of the plurality of tones to produce a desired fit to the required frequency profile.

The predetermined phase values may be determined by the steps of applying a phase value for each of the plurality of tones, generating a digital noise signal based on the sum of the plurality of tones, and repeating the steps of applying a phase value and generating a digital noise signal until the digital noise signal produces a desired fit to the required frequency profile, whereby the phase values that produce the digital noise signal that produces a desired fit to the required frequency profile are used as the predetermined phase values.

The desired fit of the digital noise signal to the required frequency profile may be determined by determining the skewness and kurtosis values for the plurality of tones and comparing the skewness and kurtosis values to predetermined desired skewness and kurtosis values.

The predetermined frequency, amplitude and phase values are associated with the corresponding predefined frequency profile and may be stored in a memory.

According to a second aspect, the invention provides an apparatus for generating noise according to a predefined frequency profile, the apparatus comprising:

a memory for storing predetermined frequency, amplitude and phase values for each of a plurality of tones for each of a plurality of predefined frequency profiles;

a digital signal processor coupled to the memory for obtaining the predetermined frequency, amplitude and phase values for the plurality of tones for a selected one of the plurality of predefined profiles and for generating a digital noise signal based on a sum of the plurality of tones; and a synthesizer coupled to the digital signal processor for receiving the digital noise signal and for generating a wander noise signal from the digital noise signal.

In one embodiment, the digital signal processor further includes means for adding a centre frequency signal to the digital noise signal.

The apparatus may include means for predetermining the frequency values for each of the plurality of tones for a required frequency profile by determining a frequency range for the required frequency profile, the required frequency range having upper and lower frequency limits, determining the plurality of tones required to provide a desired tone density in the determined frequency range, and determining frequency values for each of the plurality of tones.

The means for predetermining the frequency values may determine a geometrical tone spacing between the upper and lower frequency limits to produce the predetermined frequency values for each of the plurality of tones.

The apparatus may include means for predetermining the amplitude values for the plurality of tones by iteratively determining an amplitude value for each of the plurality of tones to produce a desired fit to the required frequency profile.

The apparatus may include means for predetermining the phase values for the plurality of tones by applying a phase value for each of the plurality of tones, generating a digital noise signal based on the sum of the plurality of tones, repeating the steps of applying a phase value and generating a digital noise signal until the digital noise signal produces a desired fit to the required frequency profile, whereby the phase values that produce the digital noise signal that produces a desired fit to the required frequency profile are used as the predetermined phase values.

The means for predetermining the phase values may include means for determining the skewness and kurtosis values for the plurality of tones and comparing the skewness and kurtosis values to predetermined desired skewness and kurtosis values.

BRIEF DESCRIPTION OF THE DRAWINGS

One embodiment of the invention will now be more fully described, by way of example, with reference to the drawings, of which.

DETAILED DESCRIPTION OF THE DRAWINGS

As is known, TDEV can be calculated from the phase difference between a clock signal and its ideal position in time. The phase difference is termed time interval error (TIE). TDEV may be calculated from TIE thus:

$$TDEV(\tau) = \sqrt{\frac{1}{6n^2(N-3n+1)} \sum_{j=1}^{N-3n+1} \left(\sum_{i=j}^{n+j-1} x_{i+2n} - 2x_{i+n} + x_i\right)^2}$$

where $x_i$=TIE; N=number of samples; $\tau_0$=sample period; $\tau$=observation interval=$n\tau_0$.

To determine the phase noise transfer characteristic of a device, the test signal with a TDEV characteristic is input to a device, and the output phase noise is measured.

TDEV may also be expressed as the power spectral density of phase ($S_\phi$) and time interval error ($S_x$), where time interval error $x(t)=\phi(t)/(2\pi v_{norm})$. From ITU Standard II.3/G.810, this gives:

$$TDEV(\tau) = \sqrt{\frac{2}{3(\pi v_{norm}n)^2} \int_0^{f_h} S_\phi(f) \frac{\sin^6(\pi n \tau_0 f)}{\sin^2(\pi \tau_0 f)} df}$$

where $v_{norm}$=nominal frequency of reference with wander and $S_\phi(f)$ and $S_x(f)$ are related by the following equation:

$$S_x(f) = \frac{1}{(2\pi v_{norm})^2} S_\phi(f)$$

Hence:

$$TDEV(\tau) = \sqrt{\frac{8}{3n^2} \int_0^{f_h} S_x(f) \frac{\sin^6(\pi n \tau_0 f)}{\sin^2(\pi \tau_0 f)} df}$$

As the largest frequency is f=10 Hz and the largest $\tau_0$=(⅟30) ms, then $\pi\tau_0 f \leq 1.047$, and $n\square.\square$ $\sin(\pi\tau_0 f) \approx \square n \square . \square \pi\tau_0 f = \pi\tau f$. Hence:

$$TDEV(\tau) = \sqrt{\frac{8}{3} \int_0^{f_h} S_x(f) H^2(\tau, f) df}$$

where:

$$H(\tau, f) = \sqrt{\frac{8}{3} \frac{\sin^3(\pi\tau f)}{(\pi\tau f)}}$$

Figure 1:
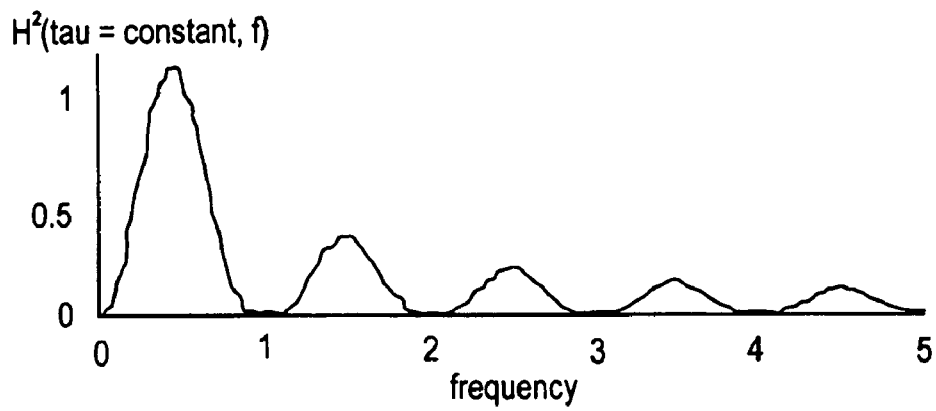
FIG. 1 shows a typical frequency response of TDEV for a constant time interval.
Figure 3:
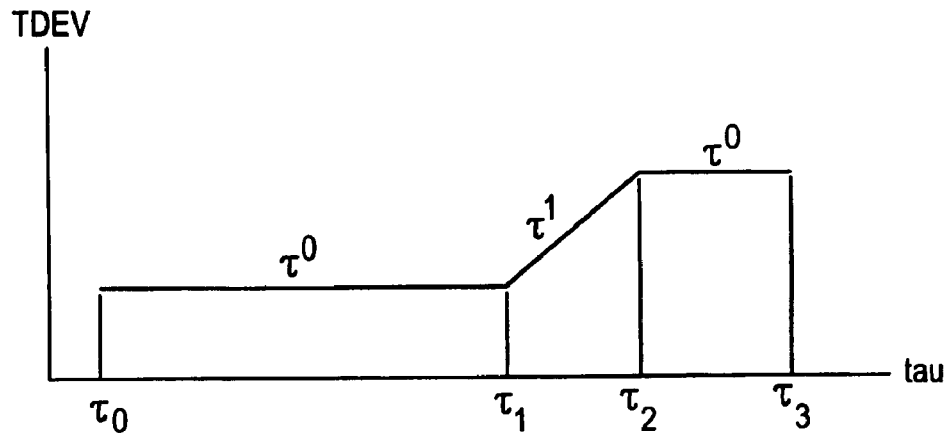
FIG. 3 shows an example of an input TDEV characteristic profile varying with time as specified by the ITU.

The squared transfer function $H^2$ (tau, f) is shown in FIG. 1 for varying frequency and a constant tau. It can be seen that the function $H^2$ (tau, f) has peaks at a frequency of 0.42/tau. Thus, TDEV can be expressed as a bandpass filter centered on a frequency of 0.42/tau. An example input TDEV noise characteristic is shown in FIG. 3, with TDEV changing by powers of tau between different values of tau. Such profiles are specified by the ITU for noise signals to be used for testing networks.

Figure 2:
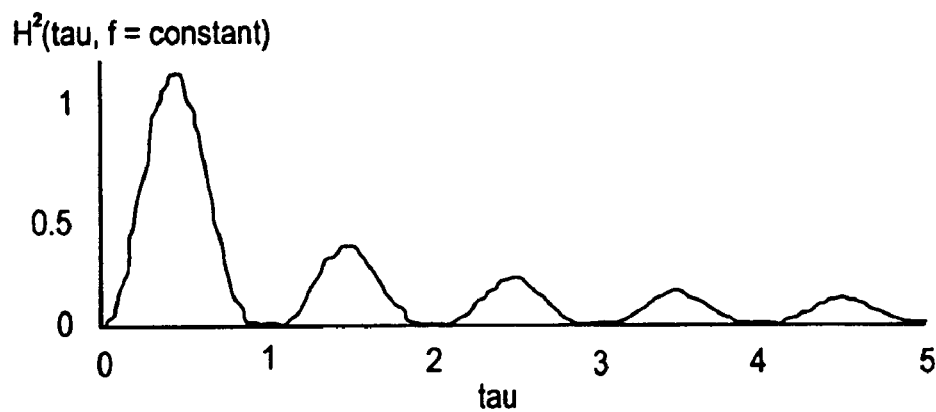
FIG. 2 shows a typical time response of TDEV for a constant frequency.

The transfer function squared $H^2$ (tau, f) is shown in FIG. 2 for varying tau for a single frequency tone, from which it can be seen that the response is the same as that shown in FIG. 1. It is therefore possible to use a sine wave with an arbitrary frequency f to produce a sequence to modulate a clock signal. This will produce the response shown in FIG. 2. The magnitude of the TDEV response is in direct proportion to the amplitude of the sine wave used to modulate the clock signal.

Figure 8:
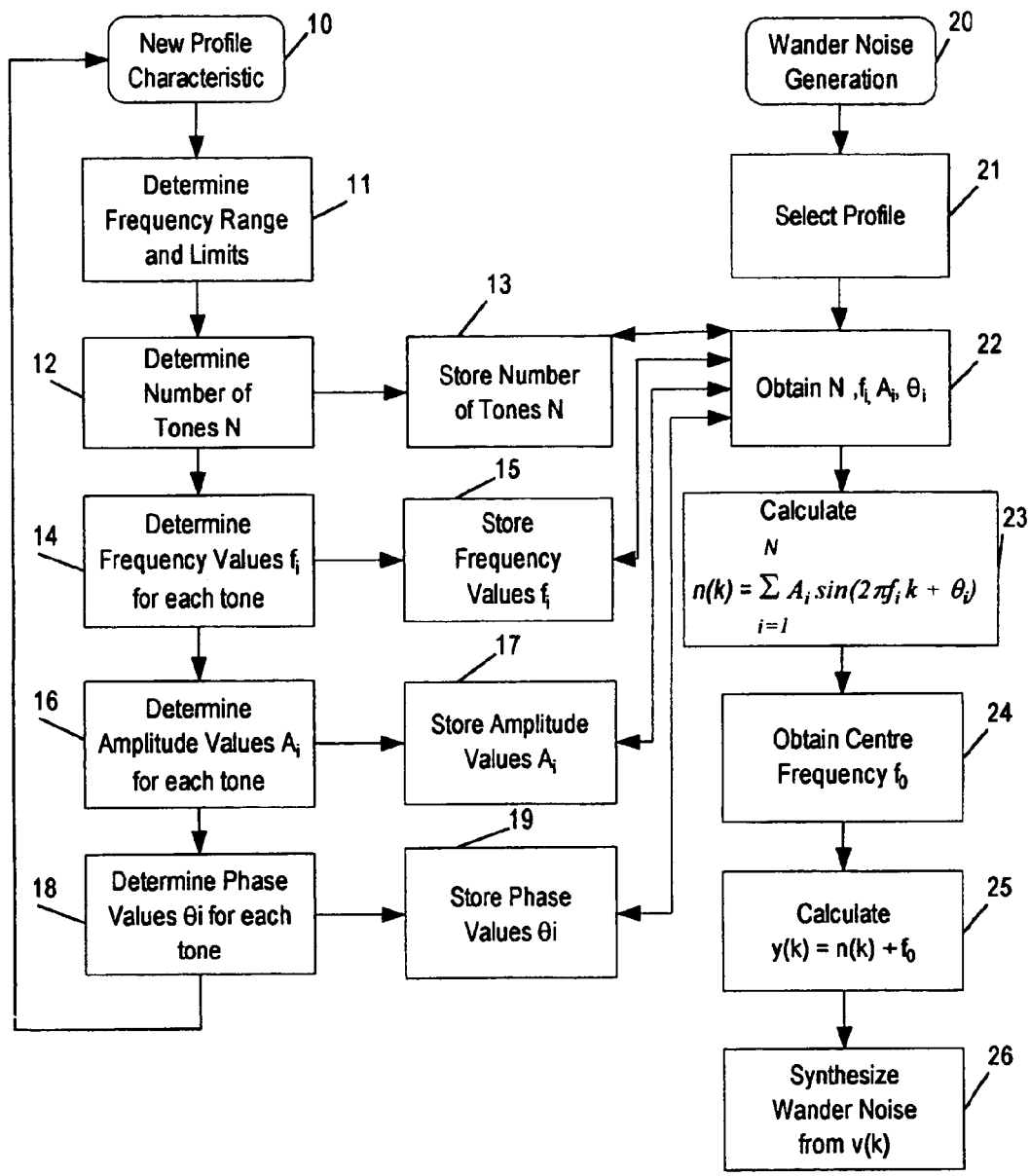
FIG. 8 shows a schematic flowchart of the method of generating wander noise according to an embodiment of the present invention.

Accordingly, sine waves of different frequencies can be used to produce a sequence, which will modulate the clock signal. The resulting TDEV response will be the combination of the individual sine wave TDEV responses. The required TDEV response can be obtained by altering the relative gains and frequencies of the sine waves. A method for determining the parameters of the sine waves will now be described with reference to FIG. 8, which is a schematic flowchart showing the main steps involved.

When a new TDEV profile is provided 10, the required range of frequencies of the sine waves can be determined 11 by considering the extremal tau limits for a specific mask. An ITU mask will specify upper and lower limits for tau (as shown in FIG. 3). In order to provide full TDEV coverage, the frequency range for the required tones is therefore chosen to be one decade higher than the highest bandpass filter centre frequency (0.42/tau) associated with the mask and to be one decade lower than the lowest bandpass filter centre frequency associated with the mask.

By choosing an appropriate tone density for the frequency range, the number of tones N (frequencies) needed can be determined 12 and stored 13. The tone density between the maximum and minimum tone frequencies has to be such that the resulting TDEV noise signal meets the ITU mask requirement. Experimentation has shown that a tone density of 40 tones/decade in which the tone spacing is arranged geometrically is sufficient to provide good coverage of a mask yielding all the frequency values ($f_i$) 14. The frequency values $f_i$ for each of the tones are then stored 15.

Having selected the frequency values $f_i$ of all the tones, the amplitude $A_i$ of the tones is obtained 16 by iteratively fitting amplitudes to all the tones and selecting the amplitude for a given tone which produces the closest fit to the mask. A computer program, such as a limit fit program can be utilised to generate the actual gain values of the sine waves which results in a wander noise profile (mask) as specified by ITU. This program attempts to generate a TDEV response between given limits using sine waves. For example, an arbitrary set of amplitude values combine to give a TDEV characteristic. This TDEV characteristic is compared with a chosen mask and its limits. When the TDEV response first breaks the limits, the sine waves after this break are adjusted to allow the response to stay within the mask. The output of the limit fit algorithm yields all the amplitude values ($A_i$), which are then stored 17.

Figure 4:
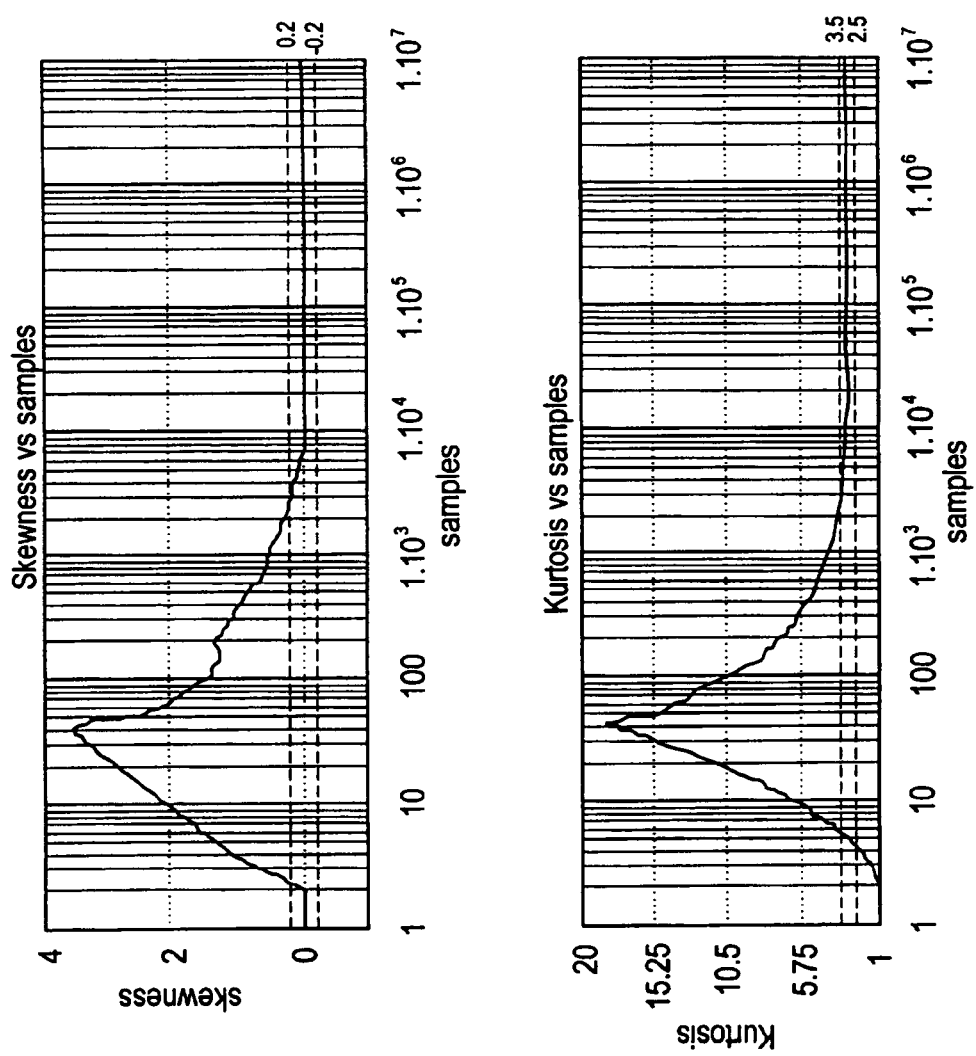
FIG. 4 shows graphs of skewness and kurtosis for a noise signal wherein all the tones have a phase value of zero.
Figure 5:
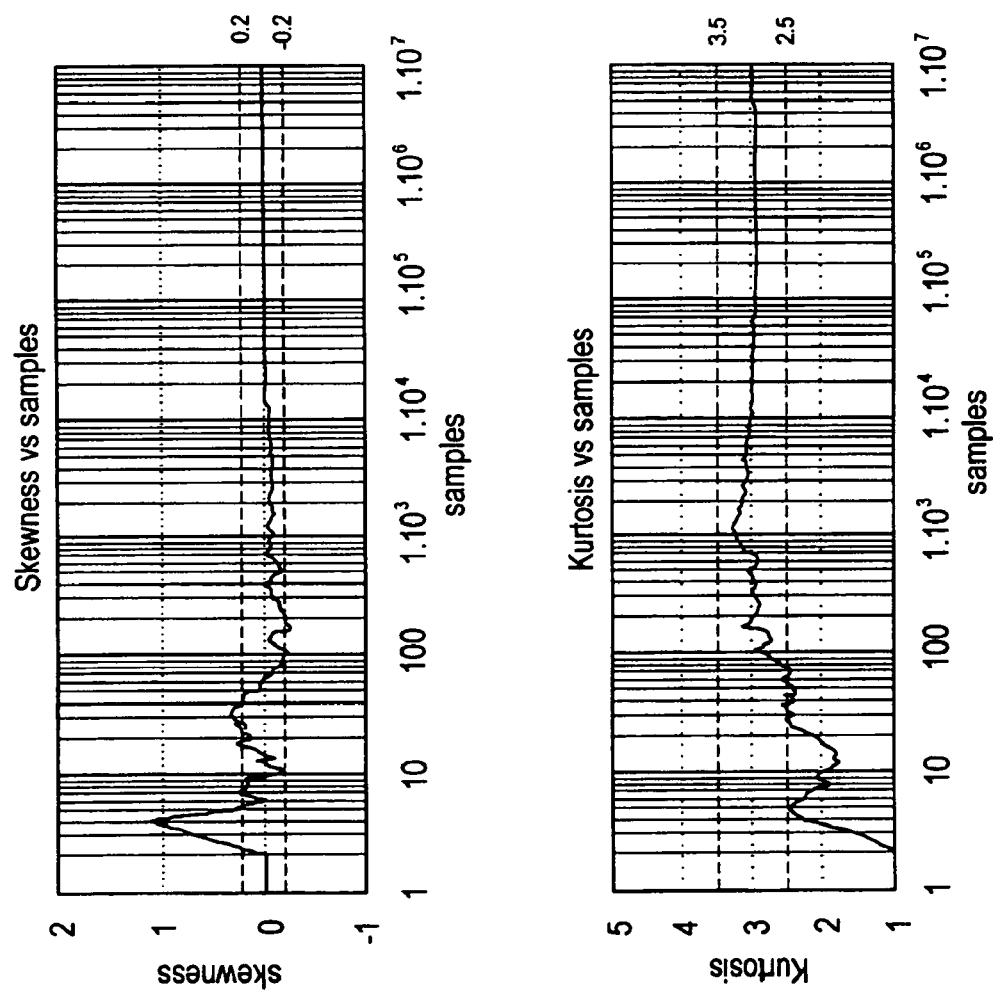
FIG. 5 shows graphs of skewness and kurtosis, similar to those of FIG. 4, but with the tones having phase values determined according to an embodiment of the invention.

The generated noise will have a characteristic within limits specified by ITU of the ideal profile. The time distribution of the wander noise has a statistical profile that can be adjusted by changing the relative phases of the sine waves. This can be achieved by Monte Carlo Analysis and produces 18 all the tone phase values ($\theta_i$). For example, the skewness and kurtosis of the generated noise can be shaped to approximate gaussian noise by adjusting the individual phase values of the tones. Gaussian noise has a skewness value of 0 and a kurtosis value of 3.0. A Monte Carlo analysis, whereby a random set of phases for all the tones is successively applied in a procedure which compares the resulting skewness and kurtosis values against the required values, can be used. The procedure is stopped when the skewness and kurtosis values are within the required limits and no significant improvement is obtained by further iteration. The phase values $\theta_i$ are then stored 19. FIG. 4 shows the skewness and kurtosis figures for a phase value of zero, before the Monte Carlo analysis and FIG. 5 shows the corresponding result following a Monte Carlo analysis, in which the skewness and kurtosis values are more typical for gaussian noise (i.e. closer to a skewness value of 0 and a kurtosis value of 3.0 even for low sample numbers) than those exhibited in FIG. 4.

Figure 6:
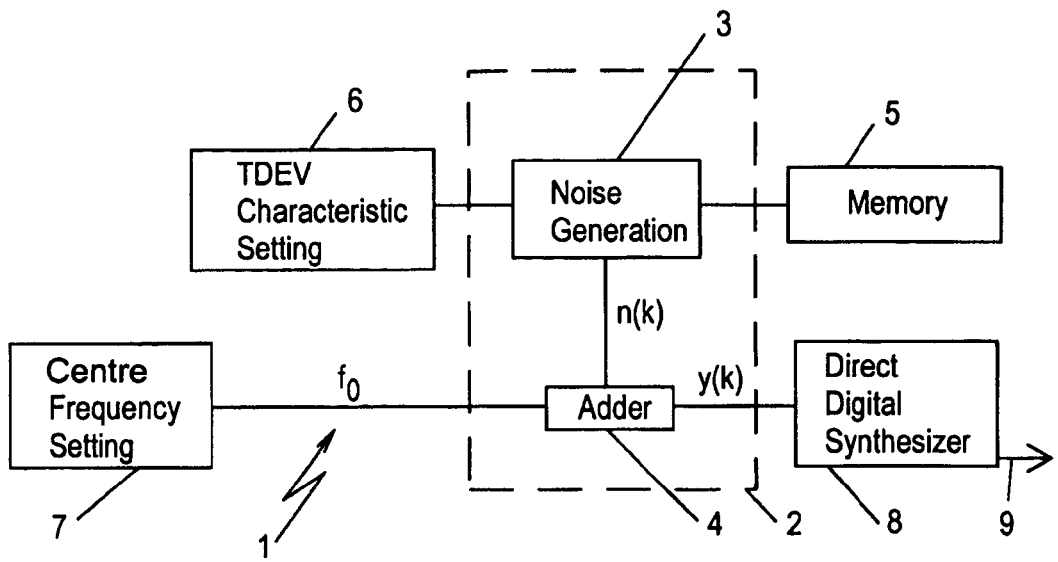
FIG. 6 shows a schematic diagram of an apparatus for generating wander noise according to an embodiment of the present invention.

An apparatus 1 for generating wander noise according to one embodiment of the present invention is shown schematically in FIG. 6. As shown, the apparatus 1 includes a processor 2, for example a Digital Signal Processor (DSP), which provides a noise generation function 3 and an adder function 4. The processor 2 receives an input 6 which comprises a selection of a particular TDEV characteristic (mask) setting that is required to be used to generate the wander noise. The selection corresponds to a frequency profile that has been predetermined and for which frequency, amplitude and phase values for a number of sine wave tones are stored in a memory 5. The processor 2 reads the which frequency, amplitude and phase values for the tones from the memory and generates a digital noise signal n(k) by the addition of these sine waves according to the equation:

$$n(k) = \sum_{i=1}^{N} A_i \sin(2\pi f_i k + \theta_i)$$

where N=number of tones, $A_i$ is the amplitude value for the particular tone i, $f_i$ is the frequency value for the particular tone i, $\theta_i$ is the phase value for the particular tone i, and k is the time index of the noise sample.

A Frequency Tuning Word value ($f_o$) which is the centre frequency for the mask is also input 7 to the processor 2 and is added by the adder function 4 to the noise sequence n(k) to produce a centred digital noise signal y(k). This centred digital noise signal is output from the processor 2 to a direct digital synthesizer 8, where it is converted to the required wander noise signal and provided at output 9 of the apparatus 1.

Figure 7:
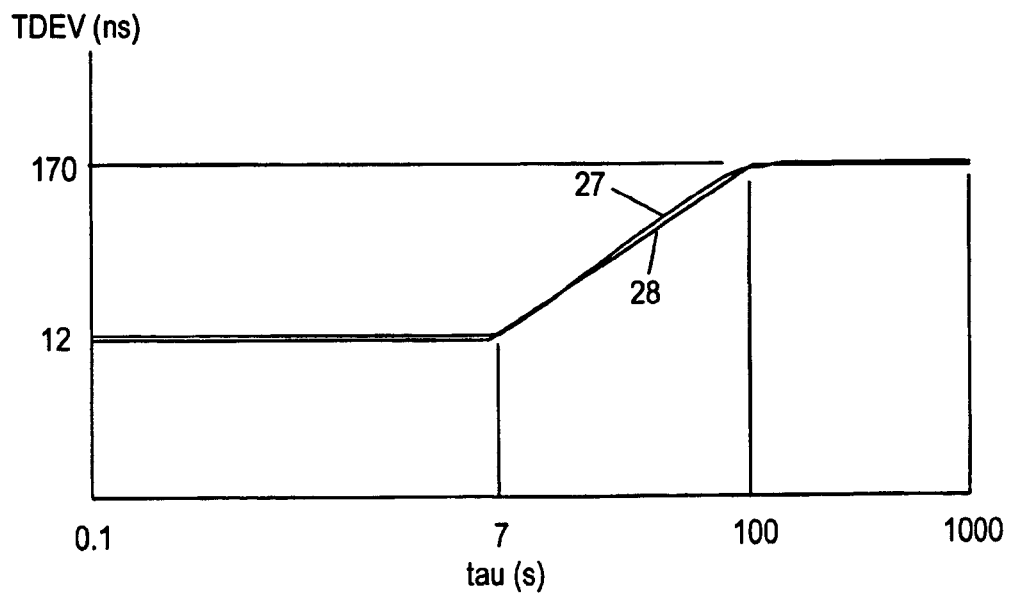
FIG. 7 shows the TDEV characteristic profile of FIG. 3 with a wander noise signal generated by the apparatus of FIG. 6 superimposed thereon.

Returning to FIG. 8, the method of operation of the apparatus of FIG. 7 is shown schematically for generating wander noise 20. As shown, a particular profile is first selected 21, and the number of tones (N), frequency values ($f_i$), amplitude values ($A_i$) and phase values ($\theta_i$) are obtained by the processor 2 from the memory 5 where they were previously stored 13–19. The digital noise signal n(k) is then calculated 23. After the centre frequency $f_o$ value is obtained 24, the centred digital noise signal y(k) is calculated 25 and then the wander noise signal is synthesized 26.

As shown FIG. 7, such a wander signal 27 is a satisfactory approximation of the desired simulated TDEV characteristic 28. The simulated TDEV mask is the same as that shown in FIG. 3.

It will be appreciated that although only one particular embodiment of the invention has been described in detail, various modifications and improvements can be made by a person skilled in the art without departing from the scope of the present invention. For example, although the tone spacing has been described as being geometrical, it will be appreciated that arithmetic or other tone spacings could be used.

The invention claimed is:

1. A method for generating wander noise according to a predefined frequency profile, the method comprising:

selecting one of a plurality of predefined frequency profiles;

providing predetermined frequency, amplitude and phase values for each of a plurality of tones for the selected predefined frequency profile;

generating a digital noise signal based on the sum of the plurality of tones; and generating a wander noise signal from the digital noise signal.

2. A method according to claim 1, further comprising adding a centre frequency signal to the digital noise signal before the wander noise signal is generated.

3. A method according to claim 1, wherein the predetermined frequency values for each of the plurality of tones are determined by:

defining a required frequency profile;

determining a frequency range for the required frequency profile, the required frequency range having upper and lower frequency limits;

determining the plurality of tones required to provide a desired tone density in the determined frequency range; and determining frequency values for each of the plurality of tones.

4. A method according to claim 3, wherein determining frequency values for each of the plurality of tones includes determining a suitable tone spacing between the upper and lower frequency limits.

5. A method according to claim 3, wherein the predetermined amplitude values for each of the plurality of tones are determined by iteratively determining an amplitude value for each of the plurality of tones to produce a desired fit to the required frequency profile.

6. A method according to claim 3, wherein the predetermined phase values are determined by:

applying a phase value for each of the plurality of tones;

generating a digital noise signal based on the sum of the plurality of tones; and repeating the steps of applying a phase value and generating a digital noise signal until the digital noise signal produces a desired fit to the required frequency profile, whereby the phase values that produce the digital noise signal that produces a desired fit to the required frequency profile are used as the predetermined phase values.

7. A method according to claim 6, wherein the desired fit of the digital noise signal to the required frequency profile is determined by determining the skewness and kurtosis values for the plurality of tones and comparing the skewness and kurtosis values to predetermined desired skewness and kurtosis values.

8. A method according to claim 1, wherein the predetermined frequency,amplitude and phase values are associated with the corresponding predefined frequency profile and stored in a memory.

9. Apparatus for generating wander noise according to a predefined frequency profile, the apparatus comprising:

a memory for storing predetermined frequency, amplitude and phase values for each of a plurality of tones for each of a plurality of predefined frequency profiles;

a digital signal processor coupled to the memory for obtaining the predetermined frequency, amplitude and phase values for the plurality of tones for a selected one of the plurality of predefined profiles and for generating a digital noise signal based on a sum of the plurality of tones; and a synthesizer coupled to the digital signal processor for receiving the digital noise signal and for generating a wander noise signal from the digital noise signal.

10. Apparatus according to claim 9, wherein the digital signal processor further includes means for adding a centre frequency signal to the digital noise signal.

11. Apparatus according to claim 9, including means for predetermining the frequency values for each of the plurality of tones for a required frequency profile by determining a frequency range for the required frequency profile, the required frequency range having upper and lower frequency limits, determining the plurality of tones required to provide a desired tone density in the determined frequency range, and determining frequency values for each of the plurality of tones.

12. Apparatus according to claim 11, wherein said means for predetermining the frequency values determines a suitable tone spacing between the upper and lower frequency limits to produce the predetermined frequency values for each of the plurality of tones.

13. Apparatus according to claim 11, including means for predetermining the amplitude values for the plurality of tones by iteratively determining an amplitude value for each of the plurality of tones to produce a desired fit to the required frequency profile.

14. Apparatus according to claim 11, including means for predetermining the phase values for the plurality of tones by applying a phase value for each of the plurality of tones, generating a digital noise signal based on the sum of the plurality of tones, repeating the steps of applying a phase value and generating a digital noise signal until the digital noise signal produces a desired fit to the required frequency profile, whereby the phase values that produce the digital noise signal that produces a desired fit to the required frequency profile are used as the predetermined phase values.

15. Apparatus according to claim 14, wherein the means for predetermining the phase values includes means for determining the skewness and kurtosis values for the plurality of tones and comparing the skewness and kurtosis values to predetermined desired skewness and kurtosis values.

* * * * *